United States Patent
Park et al.

(10) Patent No.: US 7,498,877 B2
(45) Date of Patent: Mar. 3, 2009

(54) POWER AMPLIFIER WITH AUTOMATIC SWITCHING FUNCTION

(75) Inventors: Changkun Park, Gyeongsangnam-do (KR); Songcheol Hong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 236 days.

(21) Appl. No.: 11/400,206

(22) Filed: Apr. 10, 2006

(65) Prior Publication Data

US 2006/0244524 A1    Nov. 2, 2006

(30) Foreign Application Priority Data

Apr. 27, 2005    (KR) .................... 10-2005-0035096

(51) Int. Cl.
*H03F 1/14*    (2006.01)
(52) U.S. Cl. ........................ 330/51; 330/129
(58) Field of Classification Search ............ 330/51, 330/129, 136, 124 R, 295

See application file for complete search history.

(56) References Cited

U.S. PATENT DOCUMENTS

| 5,646,578 | A | | 7/1997 | Loh et al. |
| 6,157,253 | A | * | 12/2000 | Sigmon et al. ............. 330/10 |
| 6,426,678 | B1 | | 7/2002 | Ko |
| 6,756,843 | B2 | * | 6/2004 | Charley et al. ............. 330/51 |
| 6,853,245 | B2 | * | 2/2005 | Kim et al. ............. 330/124 R |
| 6,922,102 | B2 | * | 7/2005 | Myer et al. ............. 330/51 |

OTHER PUBLICATIONS

Hyun-Min Park et al., "Demonstration of on-chip *Appended* Power Amplifier for Improved Efficiency at Low Power Region." IEEE MTT-S International Microwave Symposium, Jun. 8-13, 2003. po. 691-694.

* cited by examiner

*Primary Examiner*—Henry Choe
(74) *Attorney, Agent, or Firm*—Oliff & Berridge, PLC

(57) ABSTRACT

A power amplifier with automatic switching functions is disclosed. The power amplifier can variably control output power of circuits as all of the circuits are operated when relatively large power is needed, and the circuits are partially turned off when relatively small power is needed, according to magnitude of an envelope signal, such that the circuits can be smoothly and automatically switched so as not to affect operations of the circuit, and to improve efficiency and operation range thereof, as parts of the circuit can be turned off/on depending on magnitudes of output power.

11 Claims, 7 Drawing Sheets

POWER AMPLIFIER WITH AUTOMATIC SWITCHING FUNCTION

BACKGROUND OF THE INVENTION

1. Field of the Invention

The present invention relates to technology of power amplification, and more particularly to a power amplifier with an automatic switching function, which is capable of variably controlling output power of circuits of the power amplifier, so that the circuits are fully operated when relatively large power is needed, and the circuits can be partially turned off when relatively small power is needed, according to magnitude of an envelope signal, such that the circuits can smoothly and automatically perform switching operations to improve efficiency and operation range thereof.

2. Description of the Related Art

A power amplifier used in a wireless mobile communication device has employed a method for controlling circuits thereof, such that the circuits can be partially operated to improve efficiency of the power amplifier in the entire operation range of output power. More specifically, the method increases efficiency of the power amplifier in the entire range of output power as all of the circuits are turned on when relatively large output power is needed and a part of the circuits is turned off when relatively small output power is needed.

Such a method has been disclosed in a report "Hyun-Min PARK, et al., 'Demonstration of on-chip appended power amplifier for improved efficiency at low power region' IEEE MTT-S International Microwave Symposium."

FIG. 1 is a circuit block diagram illustrating a prior art power amplifier with a polar structure, which is used in a wireless mobile communication system.

As shown in the figure, a radio frequency input signal is a signal whose amplitude is constant and whose phase has information.

Generally, the envelope signal is a signal whose envelope has information in a voltage form, and whose frequency is less than that of a radio frequency signal.

When such an envelope signal is inputted to the power amplifier, the power amplifier can be switched.

Most of the power amplifiers are configured such that each power amplifier includes a plurality of amplification groups to guarantee satisfactory operation throughout entire range of the power amplifier and to improve efficiency of the power amplifier. More specifically, all of the amplification groups in the power amplifier are turned on when relatively large output power of the power amplifier is needed, and a part of the amplification groups is turned off when relatively small output power of the power amplifier is needed.

Therefore, a system employing such a power amplifier can improve efficiency thereof when small output power is needed.

Especially, a power amplifier with a polar structure, which is used in a wireless mobile communication system, can improve operation range thereof as a part of the amplification groups is turned off as occasion demands.

FIG. 2 is a circuit block diagram illustrating the prior art power amplifier whose amplification groups are three.

As shown in the figure, when the power amplifier is constructed to include a plurality of amplification groups, the plurality of amplification groups must be partially turned off according to change of magnitude of an envelope signal or change of output power. In order to determine as to whether the plurality of amplification groups are turned on or off, control signals 201, 202 and 203 are additionally applied to the amplification groups from the outside.

However, the prior art power amplifier employing the above-mentioned control method has disadvantages in that such additional control signals, which partially turn on/off the amplification groups, must be obtained from the outside. Also, the prior art power amplifier has drawbacks in that it complicates an external control circuit for generating the control signals.

Namely, the prior art power amplifier has disadvantages in that it requires external control signals from the outside, in which the control signals are applied to the power amplifier to partially turned off a part of the circuits in the power amplifier when magnitude of the output power is decreased to a predetermined level.

On the other hand, the prior art power amplifier has disadvantages in that, when a part of the circuits in the power amplifier is instantaneously turned off or on by the external control signals, characteristics of the circuits are abruptly changed such that the system using the power amplifier can be malfunctioned.

SUMMARY OF THE INVENTION

Therefore, the present invention has been made in view of the above problems, and it is an object of the present invention to provide a power amplifier with an automatic switching function which is capable of variably controlling output power of circuits in the power amplifier, as all of the circuits are operated when relatively large power is needed, and the circuits can be partially turned off when relatively small power is needed, according to magnitude of an envelope signal, such that the circuits can smoothly and automatically perform switching operations to improve efficiency and operation range thereof.

In accordance with an aspect of the present invention, the above and other objects can be accomplished by the provision of a power amplifier with automatic switching function comprising: a plurality of power amplification groups to which an envelope signal is inputted; and a plurality of switching circuits for individually turning on/off the plurality of power amplification groups according to magnitude of the inputted envelope signal on the basis of respective reference voltages, wherein the plurality of switching circuits are installed to respective front ends of the plurality of power amplification groups or to the plurality of power amplification groups, respectively.

Preferably, the respective reference voltages are different from each other.

Preferably, the power amplifier is a type of non-linear power amplifier with a polar structure or a type of linear power amplifier.

Preferably, the power amplifier may further comprise a power detector to detect magnitude of the envelop signal to be outputted by the power amplifier when the power amplifier is a linear power amplifier.

Preferably, the switching circuit is a PMOS transistor whose drain is connected to a switching input lead of the power amplifier, whose gate inputs a reference voltage, and whose source inputs an envelope signal.

Preferably, each of the switching circuits is a PMOS transistor whose drain is connected to a switching input lead of the power amplifier, whose gate inputs the envelope signal, and whose source inputs the reference voltage.

Preferably, the envelope signal includes information in a voltage form.

The power amplifier according to the present invention is operated such that, in a state where a plurality of driving amplification groups are set to have reference voltages which are different from each other, as the driving amplification groups are switched according to an envelope signal applied thereto, and rear ends of the driving amplification groups are turned on/off accordingly, a part of the circuits in the power amplifier are turned on/off to improve efficiency and operation range thereof, and abrupt operation of the power amplifier can be prevented as the driving amplification groups are smoothly switched by changes of resistances.

BRIEF DESCRIPTION OF THE DRAWINGS

The above and other objects, features and other advantages of the present invention will be more clearly understood from the following detailed description taken in conjunction with the accompanying drawings, in which:

FIG. 4 is a detailed circuit block diagram of a power amplification group to which a switching circuit of FIG. 3 is connected to;

DESCRIPTION OF THE PREFERRED EMBODIMENTS

While the invention has been shown and described with respect to the preferred embodiments, it will be understood by those skilled in the art that various changes and modifications may be made without departing from the scope and spirit of the invention. Thus, the scope of the invention should not be limited by the embodiments of the present invention.

Figure 3:
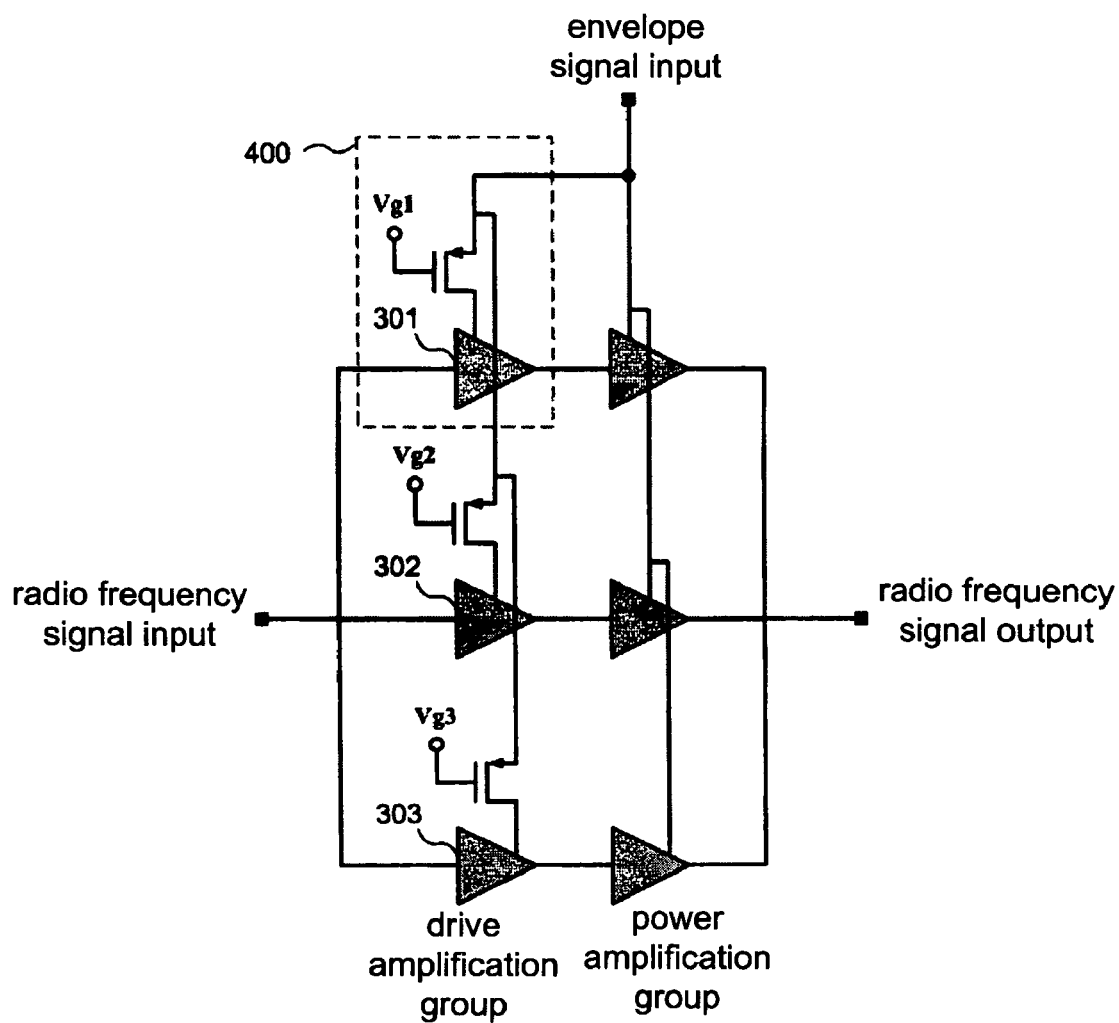
FIG. 3 is a circuit block diagram illustrating a power amplifier with an automatic switching function according to the present invention.

FIG. 3 is a circuit block diagram illustrating a power amplifier with an automatic switching function according to the present invention.

As shown in the figure, the drive amplification groups adapt switching circuits, respectively. Namely, the switching circuits, each of which is a PMOS transistor, are located between envelope signal input terminals and the driving amplifications groups.

For example, when the envelope signal is varied from 3.3V to 0V, reference voltages Vg1, Vg2 and Vg3 can input 2V, 1V and 0V to the amplification groups, respectively. When the PMOS transistor used as a switch has a threshold voltage of 0.7V, the driving amplification group 301 may be turned off as the envelope signal, whose magnitude is less than 2.7V, is inputted thereto. Also, when the magnitude of the envelope signal is less than 1.7V, the driving amplification group 302 is turned off. Therefore, the circuits in the power amplifier can be automatically turned off or on without application of external signals.

Figure 4:
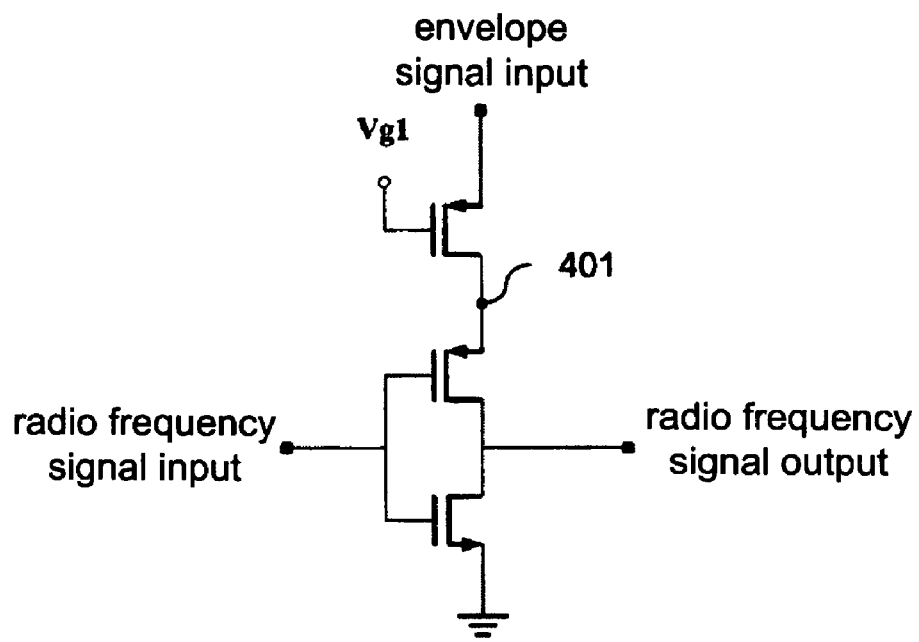

FIG. 4 is a detailed circuit block diagram of a power amplification group to which a switching circuit of FIG. 3 is connected. Namely, FIG. 4 is a detailed circuit illustrating a block 400 of FIG. 3, which is referred to as a power amplification group to which a switching circuit is connected.

As shown in the figure, the drive amplification group is configured such that its output lead is class D. A PMOS transistor is located between the D-class output lead and the envelope signal terminal in order to perform an automatic switching operation.

Figure 5:
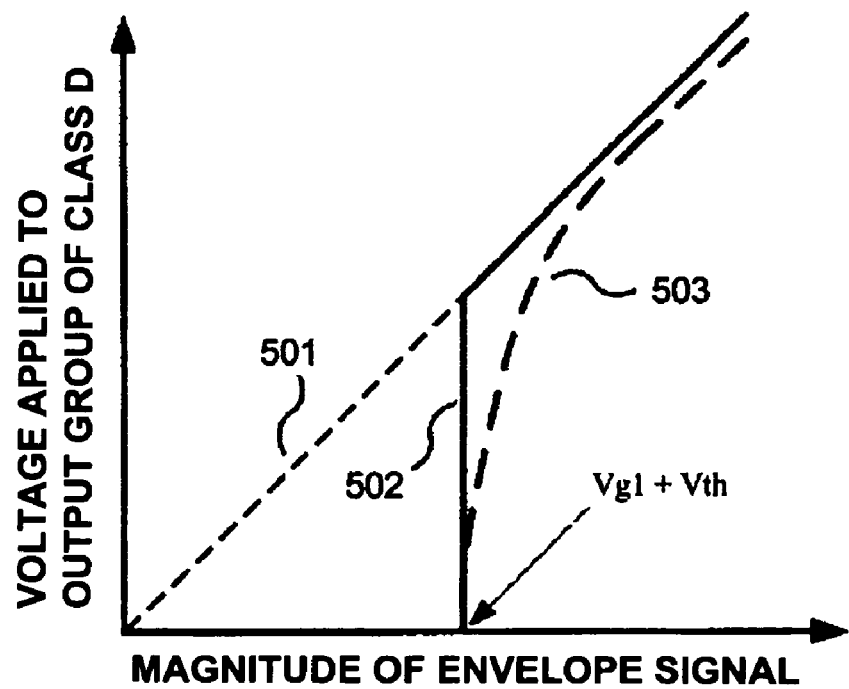
FIG. 5 is a graph illustrating a voltage applied to a power amplification group according to magnitude of an envelope signal.

When the envelope signal is changed, FIG. 5 illustrates how voltage of node 401 can be changed. Namely, as shown in FIG. 5, when magnitude of the envelope signal is less than Vg1+Vth (Vth is a threshold voltage of the PMOS transistor), the circuit of FIG. 4 is completely turned off with a characteristic like graph 502 of FIG. 5.

When the PMOS transistor used as an automatic switching element is not employed in the circuit, voltage of node 401 is changed like graph 501 of FIG. 5. Therefore, the circuit is not turned off or on at a desired magnitude of the envelope signal.

When the automatic switching circuit is configured as shown in FIG. 4, the circuit has a characteristic of graph 502. However, when voltage difference between the gate and source of the PMOS transistor is reduced, since resistance component of the PMOS transistor is increased, the circuit has a characteristic like graph 503 of FIG. 5. Therefore, the drive amplification group connected to the PMOS transistor is abruptly turned off, instead of smoothly turned off.

Figure 6:
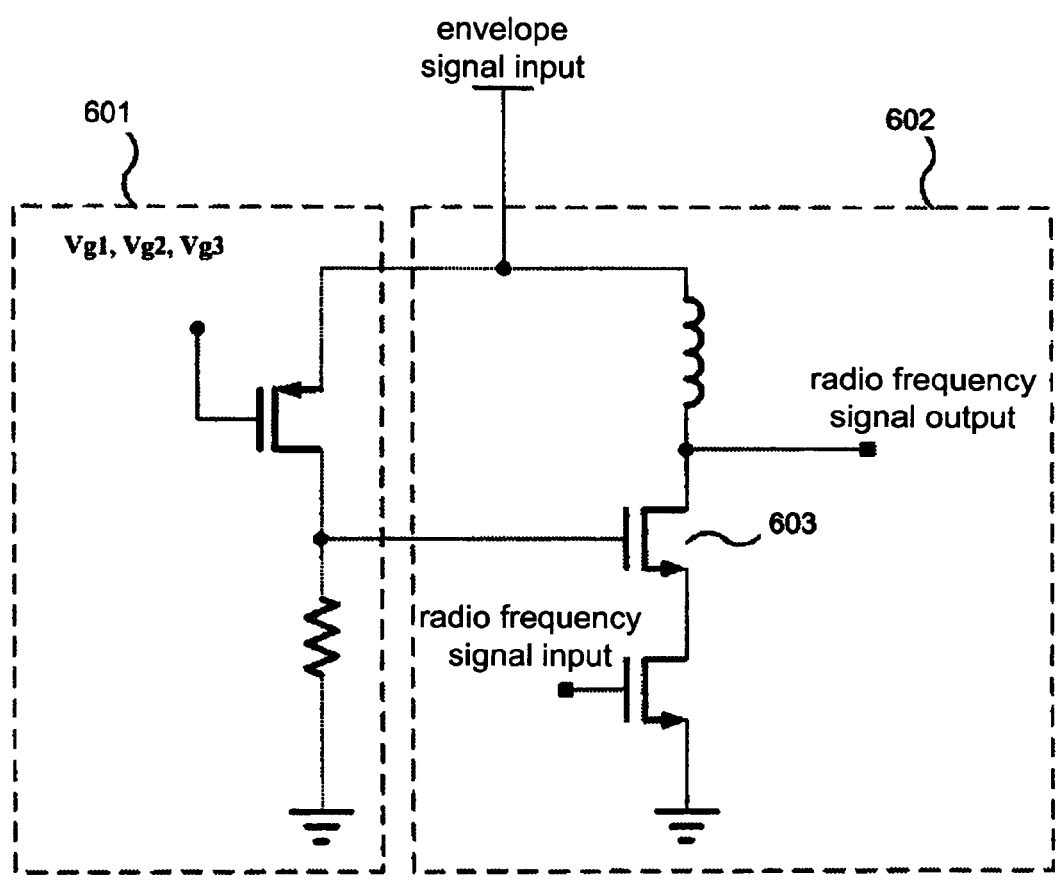
FIG. 6 is a circuit block diagram of an automatic switching circuit adapted to a cascade amplification group.

FIG. 6 is a circuit block diagram of an automatic switching circuit adapted to a cascade amplification group.

As shown in the figure, the gate of NMOS transistor 603 of the power amplification group 602 is connected to the automatic switching circuit 601. Namely, the power amplification group of FIG. 6 configured as a Cascode structure is constructed such that the NMOS transistor 603 of the Cascode power amplification group 602 is connected to the PMOS transistor and a resistor in the automatic switching circuit 601. Therefore, a turned off level of the circuit is controlled according to a voltage of the gate of the PMOS transistor. Namely, when the PMOS transistor of the automatic switching circuit 601 is automatically turned off as magnitude of the envelope signal is less than a predetermined value, the gate of the Cascode NMOS transistor 603 of the power amplification group 602 is grounded. Therefore, the Cascode transistor is turned off, and therefore the power amplification group 602 is partially turned off.

Figure 1:
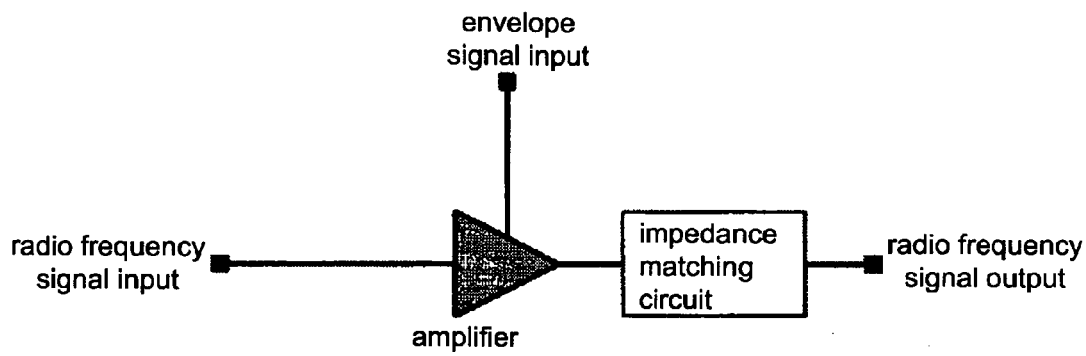
FIG. 1 is a circuit block diagram illustrating a prior art power amplifier with a polar structure, which is used in a wireless mobile communication system.
Figure 2:
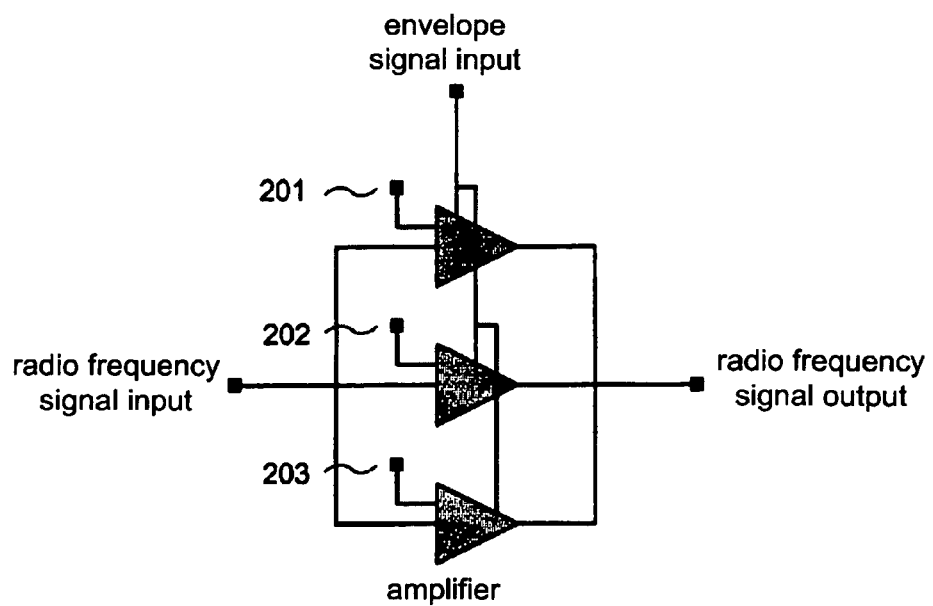
FIG. 2 is a circuit block diagram illustrating the prior art power amplifier including three amplification groups.

Using such a principle, a plurality of power amplification groups can be configured, as FIG. 2, to form an automatic switching circuit. Namely, the automatic switching circuit is operated such that the plurality of power amplification groups is partially turned off or on according to change of envelope signals.

Figure 7:
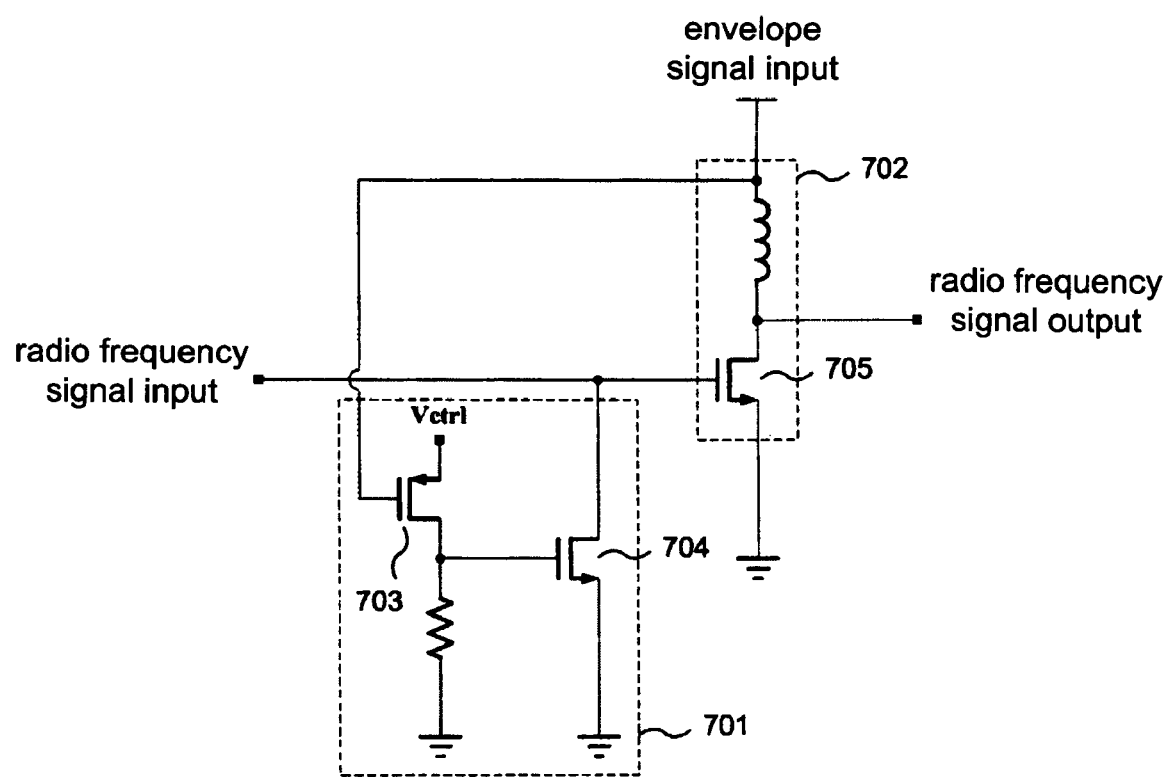
FIG. 7 is a circuit block diagram of an automatic switching circuit adapted to an amplification group whose structure is not a cascade.

FIG. 7 is a circuit block diagram of an automatic switching circuit adapted to an amplification group whose structure is not a cascade.

As shown in the figure, a varying envelope signal is applied to the gate of the PMOS transistor 703. When the envelope signal is decreased less than a predetermined voltage according to a value Vctr1, the PMOS transistor 703 is turned on, thereby turning on the NMOS transistor 704. In such a state, when the voltage of the gate of the power amplification group 705 is decreased less than the threshold voltage, the power amplification group 705 is turned off.

When a circuit is configured as FIG. 2 based on such a principle, the amplification groups in the circuit can be automatically turned on/off according to change of magnitude of an envelope signal, which is referred to as an automatic switching circuit.

Namely, using such a principle, a plurality of power amplification groups can be configured, as FIG. 2, to form an automatic switching circuit. Namely, the automatic switching circuit is operated such that the plurality of power amplification groups is partially turned off or on according to change of an envelope signal.

As such, a power amplifier can be designed using such an automatic switching circuit. After that, operations of the automatic switching circuit can be checked through the designed result.

Figure 8:
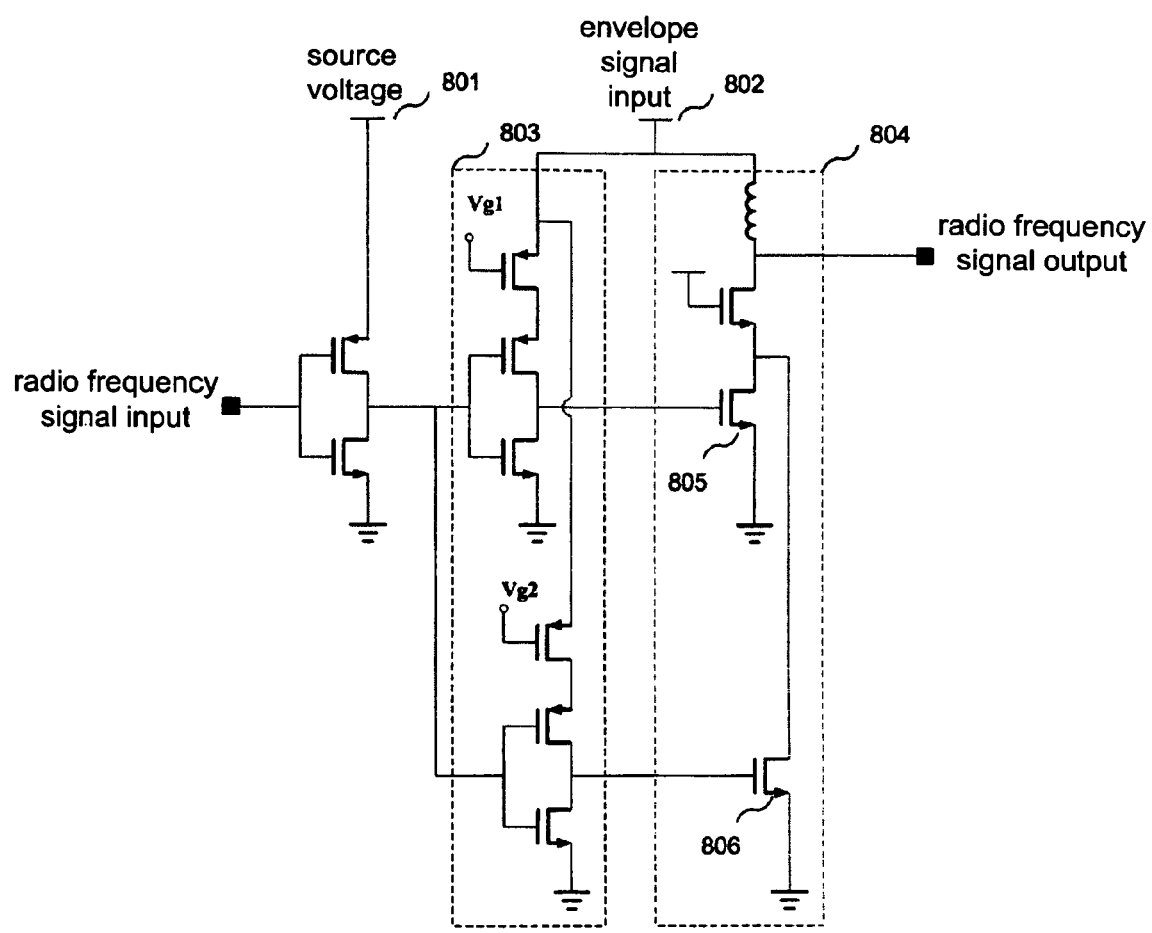
FIG. 8 is a circuit block diagram of a power amplifier with an automatic switching function according to another embodiment of the present invention.

FIG. 8 is a circuit block diagram of a power amplifier adapting automatic switching technology as shown in FIG. 4, in which a part of the drive amplification groups and a part of the power amplification groups are turned off together when magnitude of the envelope signal is decreased to a predetermined value.

As shown in the figure, when reference voltages Vg2 and Vg1 are 0v and 2V, respectively, the output power and efficiency of the circuit can be simulated while the envelope signal is varied. More specifically, when the magnitude of the envelope signal is varied from 0.9V to 3.3V, and the magnitude of the envelope signals is decreased less than a predetermined value, NMOS transistor 805 of the power amplification group 804 and the drive amplification group 803, which is connected to the NMOS transistor 805, are turned off. Therefore, only the drive amplification group is turned on, in which the drive amplification group is connected to the NMOS transistor 806. Such a case can be performed when relatively low output power is needed. Therefore, since a part of the circuit is turned off, consumption of power in the circuit is decreased, instead efficiency of the circuit is increased.

Figure 9:
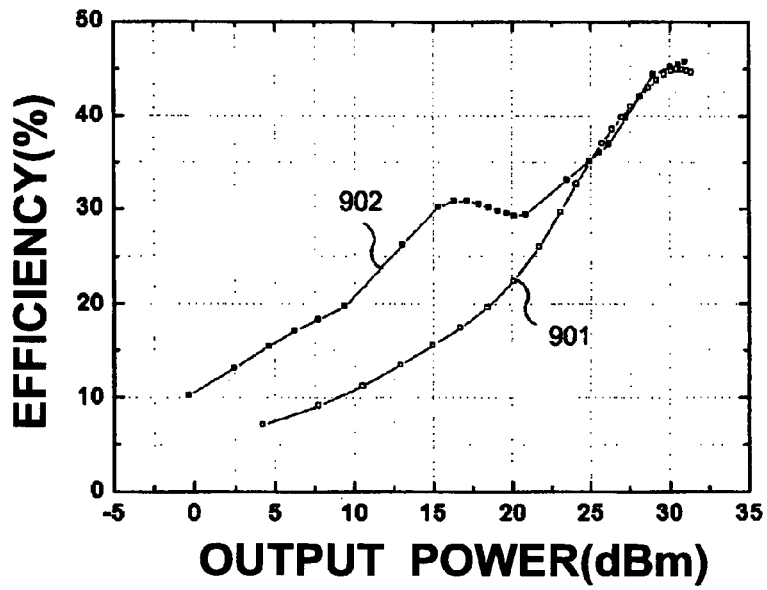
FIG. 9 is graphs from computer simulation for a power amplifier with an automatic switching function according to the present invention.

FIG. 9 is graphs from computer simulation for a power amplifier with an automatic switching function according to the present invention.

As shown in the figure, graph 901 denotes a case where an automatic switching circuit is not used, and graph 902 denotes a case where an automatic switching circuit is utilized. Namely, when the magnitude of an envelope signal is decreased by the automatic switching circuit, a part of the power amplifier, which outputs relatively large amount of power, is turned off, instead a part of the power amplifier, which outputs relatively small amount of power, is turned on, thereby increasing efficiency of the circuit. As such, since a part of the power amplifier is turned off when outputting relatively small power, the circuit can make its operation range wide, compared with a circuit in which an automatic switching circuit is not used.

The above-mentioned embodiments have described how to perform automatic switching operations by a non-linear power amplifier utilized in a wireless mobile communication system. The power amplifier with a polar structure inputs an envelope signal and a phase signal, respectively.

However, since a general linear-power amplifier inputs radio frequency signals in which a phase signal and an envelope signal are mixed, the magnitude of the envelope signal outputted from the power amplifier must be detected in order to use an automatic switching circuit in the linear power amplifier.

Figure 10:
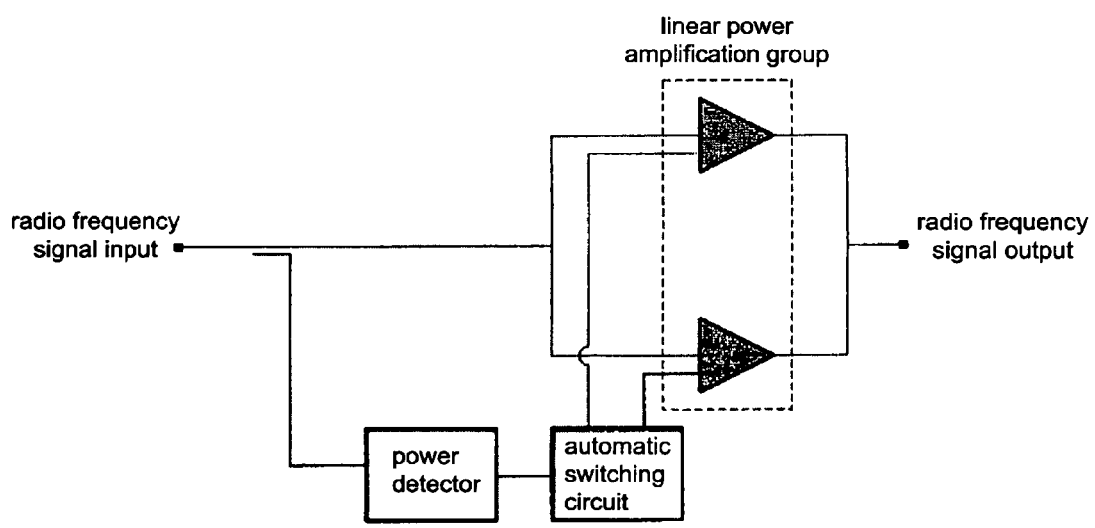
FIG. 10 is a circuit block diagram of a linear power amplifier to which an automatic switching circuit according to the present invention is applied.

Therefore, as shown in FIG. 10, envelope information is changed to an envelope signal as a voltage form through the power amplifier. When the detected envelope signal is inputted to the automatic switching circuit, a part of the power amplifier can be turned off similar to the above-mentioned non-linear power amplifier.

As mentioned above, the power amplifier with an automatic switching function according to the present invention can variably control output power of circuits as all of the circuits in the power amplifier are operated when relatively large power is needed, and the circuits are partially turned off when relatively small power is needed, according to magnitude of an envelope signal, such that the circuits can be smoothly and automatically switched so as not to affect operations thereof, and to improve efficiency and operation range thereof, as a part of the circuit can be turned off/on depending on magnitudes of output power.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power amplifier with an automatic switching function comprising:

a plurality of power amplification groups to which an envelope signal is inputted; and a plurality of switching circuits for individually turning on/off the plurality of power amplification groups according to magnitude of the inputted envelope signal on the basis of respective reference voltages, wherein the plurality of switching circuits is installed to respective front ends of the plurality of power amplification groups or to the plurality of power amplification groups, respectively, wherein the switching circuit is a PMOS transistor whose drain is connected to a switching input lead of the power amplifier, whose gate inputs the reference voltage, and whose source inputs the envelope signal.

2. The power amplifier as set forth in claim 1, wherein the respective reference voltages are different from each other.

3. The power amplifier as set forth in claim 1, wherein the power amplifier is a type of non-linear power amplifier with a polar structure or a type of linear power amplifier.

4. The power amplifier as set forth in claim 3, further comprising a power detector to detect magnitude of the envelope signal to be outputted by the power amplifier when the power amplifier is a linear power amplifier.

5. A power amplifier with an automatic switching function comprising:

a plurality of power amplification groups to which an envelope signal is inputted; and a plurality of switching circuits for individually turning on/off the plurality of power amplification groups according to magnitude of the inputted envelope signal on the basis of respective reference voltages, wherein the plurality of switching circuits is installed to respective front ends of the plurality of power amplification groups or to the plurality of power amplification groups, respectively, wherein the switching circuit is a PMOS transistor whose drain is connected to a switching input lead of the power amplifier, whose gate inputs the envelope signals, and whose source inputs the reference voltage.

6. The power amplifier as set forth in claim 1, wherein the envelope signal includes information in a voltage form.

7. The power amplifier as set forth in claim 2, wherein the envelope signal includes information in a voltage form.

8. The power amplifier as set forth in claim 3, wherein the envelope signal includes information in a voltage form.

9. The power amplifier as set forth in claim 4, wherein the envelope signal includes information in a voltage form.

10. The power amplifier as set forth in claim 1, wherein the envelope signal includes information in a voltage form.

11. The power amplifier as set forth in claim 5, wherein the envelope signal includes information in a voltage form.

* * * * *